United States Patent [19]

Mizukoshi et al.

[11] 3,879,837

[45] Apr. 29, 1975

[54] METHOD OF SOLDERING A SEMICONDUCTOR PLATE

[75] Inventors: Kanji Mizukoshi, Takatsuki; Minoru Andou, Suita; Hisao Okuno, Kyoto, all of Japan

[73] Assignee: Matsushita Electronics Corporation, Osaka, Japan

[22] Filed: Feb. 19, 1974

[21] Appl. No.: 443,670

Related U.S. Application Data

[63] Continuation of Ser. No. 277,447, Aug. 2, 1972, abandoned.

[30] Foreign Application Priority Data

Aug. 7, 1971 Japan ............................... 46-59689

Feb. 7, 1972 Japan ............................... 47-13741

[52] U.S. Cl. ................ 228/123; 228/246; 228/257; 228/56; 29/589

[51] Int. Cl. ............................................ B23k 31/02

[58] Field of Search .......... 29/473.1, 500, 503, 577, 29/589, 590; 228/56

[56] References Cited

UNITED STATES PATENTS

| | | | |
|---|---|---|---|
| 3,029,505 | 4/1962 | Reichenbaum | 29/503 X |
| 3,209,436 | 10/1965 | Kramp et al. | 29/503 X |
| 3,503,631 | 3/1970 | Greever | 29/501 X |

*Primary Examiner*—Carl E. Hall

*Attorney, Agent, or Firm*—Goldsmith & Deschamps Ladas, Parry, Von Gehr

[57] ABSTRACT

A method of soldering a semiconductor plate to a metal substrate comprising the steps of disposing or supplying solder at that portion of the metal substrate which is remote from the portion to be soldered with the semiconductor plate, and supplying the melted solder to the soldering portion of said semiconductor plate and said metal substrate through a groove provided in said metal substrate and extending from said remote portion to said soldering portion.

3 Claims, 5 Drawing Figures

METHOD OF SOLDERING A SEMICONDUCTOR PLATE

This is a continuation application Ser. No. 277,447 filed Aug. 2, 1972, and now abandoned.

This invention relates to a method of soldering a semiconductor plate, which is the main constituent of a diode or a transistor, to a metal substrate with solder.

In assembling a transistor or a diode, a smaller semiconductor plate (of the order of 0.2 to 0.5 mm square) is usually bonded to a metal substrate by the thermocompression bonding method, etc., whereas a larger semiconductor plate is usually bonded to a metal substrate with solder.

As for soldering a semiconductor plate, it is usual that a germanium plate which wets well with eutectic solder of lead-tin is directly soldered to a metal substrate, whereas a silicon plate which poorly wets with said solder is first plated with nickel or gold in the soldering portion and then soldered with a metal substrate.

In soldering a semiconductor plate with solder, it is particularly important that the whole soldering surface of a semiconductor plate wets well with solder to form good contact. If there remains a portion in the soldering portion which does not wet well with solder, it will cause such drawbacks in the resultant transistor or diode that in operation the current density through the soldered portion becomes non-uniform and if a pulse current having a very large peak value is allowed to flow the current density is locally concentrated to cause a thermal breakdown of the device.

Therefore, an object of the present invention is to provide a method of soldering a semiconductor body to a metal substrate with solder comprising the steps of: disposing a solder solid in a recessed portion of a metal substrate having said recessed portion and a groove connected with said recessed portion, and disposing a semiconductor body above said groove; and heating the assembly of said semiconductor body and said metal substrate to melt the solder disposed in said recessed portion and supplying the melted solder from the recessed portion to the bonding surfaces of said semiconductor body and said metal substrate through said groove.

Another object of the present invention is to provide a method of soldering a semiconductor body to a metal substrate with solder employing a jig for supplying solder comprising the steps of: disposing a semiconductor body at a predetermined bonding portion of a metal substrate having said portion for mounting the semiconductor body and a groove extending from said portion to the exterior, and disposing a jig on said metal substrate the jig having a straight through hole extending to a portion of said groove different from that in the bonding region; and supplying melted solder through said straight through hole and said groove to the bonding surfaces.

Figure 1:
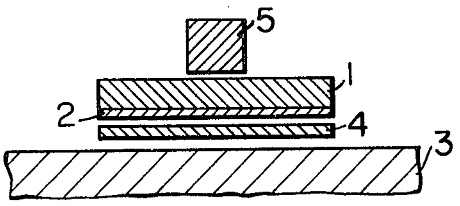
FIG. 1 PRIOR ART
Figure 2A:
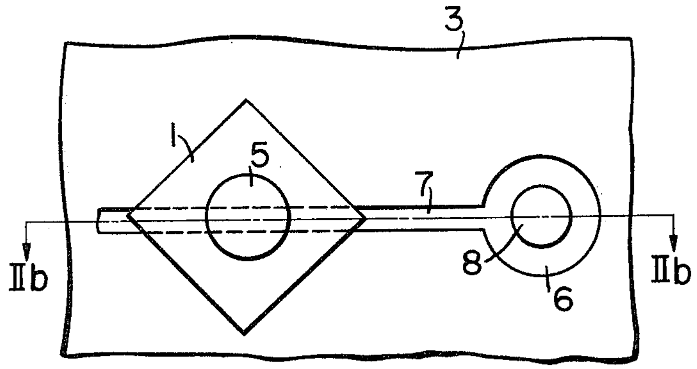
Figure 2B:
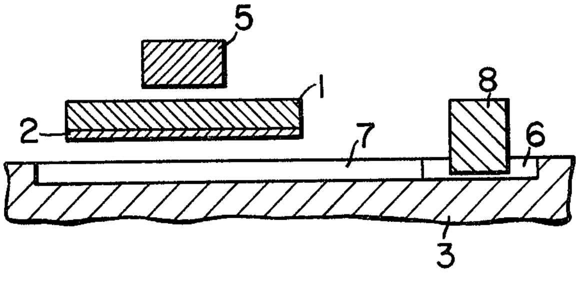
Figure 3A:
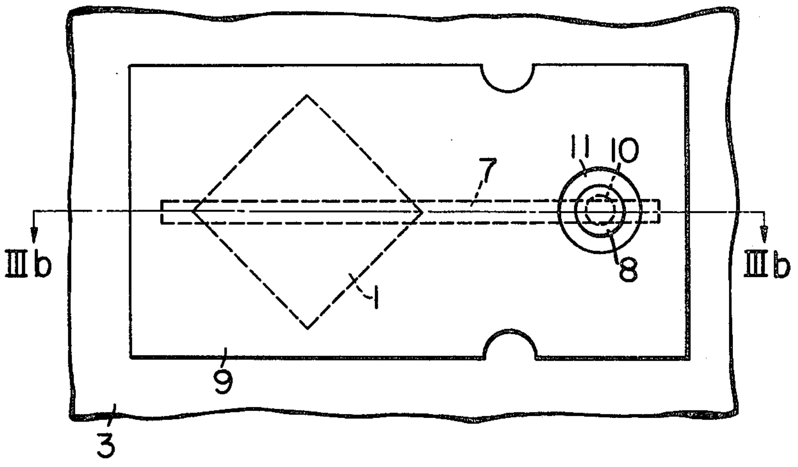
Figure 3B:
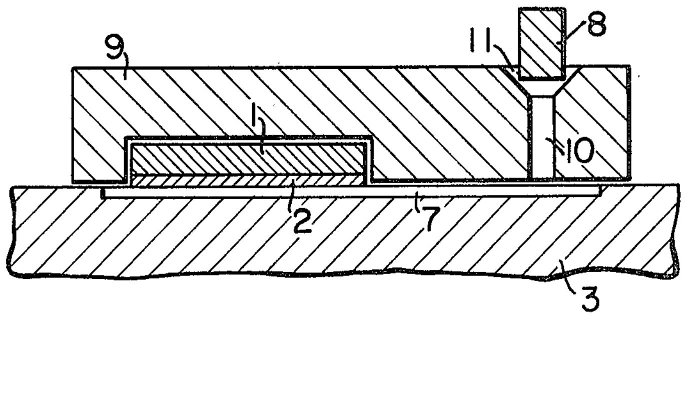

Description will now be made on the preferred embodiments in connection with the accompanying drawings, in which:

FIG. 1 is a schematic cross-sectional diagram for illustrating a conventional method of soldering a semiconductor plate to a metal substrate with solder;

FIGS. 2*a* and 2*b* are a schematic plan and a schematic cross-sectional diagrams for illustrating an embodiment of a method of soldering a semiconductor plate to a metal substrate according to the present invention, in which FIG. 2*b* is a cross-section along line II*b*—II*b* of FIG. 2*a;* and FIGS. 3*a* and 3*b* are a schematic plan and a schematic cross-sectional diagrams for illustrating another embodiment of a method of soldering a semiconductor plate to a metal substrate according to the present invention, in which FIG. 3*b* is a cross-section along line III*b*—III*b* of FIG. 3*a*.

A conventional method of soldering a semiconductor plate to a metal substrate is illustrated in FIG. 1, in which a silicon plate 1 is plated with a nickel layer 2 on one surface and placed on a metal substrate of copper 3 which also works as a heat sink through a solder member 4 which is shaped similar to the shape of the silicon plate 1. The solder member 4 is made, for example, of a lead-tin alloy plate. A weight 5 is provided above the silicon plate 1 for applying pressure during heat-treatment. The soldering of the silicon plate 1 to the metal substrate 3 is done by superposing the above parts unitarily, maintaining the superposed assembly in a furnace filled with a non-oxidizing atmosphere and then heating the assembly at a predetermined temperature so as to melt the solder.

According to the above method, however, wetting between the nickel layer 2 plated on the silicon plate 1 and the solder 4 is not always good and there may arise such portions in the nickel layer 2 that are not wet with the solder. If there exist such portions in the soldering surface, the operational current density through the bonded surface in the resultant transistor does not become uniform in the bonded surface. In case when a pulse current having an especially large peak value is allowed to flow, the current may be locally concentrated to cause a thermal breakdown of the device.

The occurrence of such portions is due to air or other gaseous material which has existed between the silicon plate and the metal substrate at the time of superposition and has not escaped from the space between the silicon plate and the metal substrate when the solder has been melted in the furnace and has been wet with the required surfaces. Namely, the air or gaseous material is surrounded with the melted solder and is unable to find a way of escape.

It can be considered, for example, on the consideration of the above point that the surface of the metal substrate is treated to have a roughness of several ten microns. When such a treatment is done, however, the concave portions formed by the treatment may form traps for the gaseous material and cause the occurrence of larger bubbles.

This invention intends to solve the above problem by controlling the flow of melted solder at the time of bonding. A solder pool or supply is formed in a portion of a metal substrate different from the portion for mounting a semiconductor plate and a groove is formed to extend from the solder supply to the portion for mounting the semiconductor plate to supply the melted solder to the soldering surfaces of the semiconductor plate and the metal substrate through said groove.

As embodiment of the present bonding method is illustrated in FIGS. 2*a* and 2*b*. FIG. 2*b* is a cross section along line II*b*—II*b* in FIG. 2*a*. A recessed portion working as a solder pool is formed in a support substrate. Solder disposed in this pool is melted and is supplied to the space between the soldering surfaces of a semiconductor plate and a metal substrate to achieve the bonding between the semiconductor plate and the metal substrate. Namely, in the figures, numeral 6 indicates a recessed portion working as a solder pool and 7 a groove extending from said recessed portion 6 to the portion where a semiconductor plate 1 is mounted. A silicon plate 1 is mounted at a predetermined position of a metal substrate 3 having such a recessed portion 6 and a groove 7. A sufficient amount of solder 8 is placed in the recessed portion 6. A suitable weight 5 is placed on the silicon plate 1 and the silicon plate 1 is depressed by this weight 5 to the metal substrate 3. This assembly disposed with the silicon plate and the solder is heat-treated in a furnace. The flow of solder to achieve good bonding is controlled in the following order:

1. The solder is melted and takes a spherical shape;
2. The spherical shape is deformed along with the increase of temperature;
3. The solder takes a liquid form and begins to flow from the solder pool 6 to the groove 7;
4. The solder fills up the groove 7;
5. Wetting of the solder with the silicon plate 1 and the metal substrate 3 begins from the portions along the groove 7, and gaseous material existing between the soldering surfaces is pushed out with the progress of wetting action; and
6. The solder extends over the whole soldering surfaces. Namely, the extension of the solder is due to the capillary phenomenon and in this process of extension, gaseous material is pushed out so that there exist no bubbles between the soldered surfaces and an extremely good contact can be made.

FIGS. 3*a* and 3*b* show another embodiment of the invention which is a further improvement of the above embodiment.

Namely, the embodiment of FIGS. 2*a* and 2*b* can achieve the purpose of providing a good contact, but may also provide such problems that the solder may get out of the solder pool if vibration is applied to the metal substrate after placing the solder on the metal substrate, that the operation of disposing the solder in the solder pool is relatively difficult, and that the space for forming a solder pool may not easily be obtained from the viewpoint of the dimension of the metal substrate. These problems can be eliminated by the embodiment of FIGS. 3*a* and 3*b*, in which a refractory jig having a straight through hole extending to a portion of a groove 7 is used in place of the solder pool shown in FIGS. 2*a* and 2*b* and disposed on a metal substrate, and melted solder is supplied to the groove through this straight through hole. In the figures, a silicon plate 1 is mounted on a metal substrate 3 at a predetermined position and a refractory jig 9 is disposed thereon in the illustrated relation. A straight hole is formed in this jig, which consists of a straight portion 10 and a funnel portion 11. The jig is so disposed that the straight through hole 10 continues to a groove provided in the metal substrate 3. After the jig is disposed on the metal substrate in the above manner, solder 8 is disposed in the funnel portion 11 of the straight through hole formed in the jig 9. Preparation before soldering is completed through the above processes and then the assembly is placed in a furnace to perform a predetermined heat treatment. The solder 8 is melted in this heat treatment. As the result of this heating, the funnel portion 11 no longer has a function of retaining the solder and the melted solder is supplied to the narrow groove 7 through the straight through hole 10. The bonding of the silicon plate is achieved according to the steps (3) to (6) of the aforementioned embodiment thereafter and a good contact can be obtained.

According to the second embodiment described above, there is no need of forming a solder pool on a metal substrate and thus inconveniences due to the existence of the solder pool can be completely eliminated.

In the above embodiment, solder is placed in a funnel portion of a straight through hole formed in a jig. Similar effects can be obtained by dropping melted solder into the straight through hole, or preliminarily disposing solder in the straight through hole.

The above description has been made typically on the soldering of a silicon plate in a silicon power transistor, but the present method can be widely applied to the soldering of a semiconductor body in a semiconductor device. Further, the narrow groove formed in a support member is not limited to one straight groove as is shown in the figures, and crossed grooves having a cross point in the soldering portion or radially extending grooves can also be employed. What is important is the existence of a part of a groove or grooves under the soldering portion of a semiconductor body as the supply of solder.

According to the present method as described above, the whole region of the soldering surfaces is wet well with solder to provide an extremely good contact and the problem of thermal breakdown due to the existence of bubbles between the soldering surfaces can be eliminated. Further, since the solder relating to the soldering of a semiconductor body is extended to the whole region of the soldering surfaces by the capillary action, the thickness of the solder relating to the bonding becomes extremely thin and the thermal resistance of a resultant semiconductor device is also lowered.

What we claim is:

1. A method of soldering a semiconductor body to a metal substrate comprising the steps of:

disposing solid solder in a recessed portion of the metal substrate having a groove connected with said recessed portion, and placing the semiconductor body above said groove at a distance from said recessed portion;

heating the assembly of said semiconductor body and said metal substrate to melt the solder disposed in said recessed portion and supply melted solder from the recessed portion to the bonding surfaces of said semiconductor body and said metal substrate through said groove.

2. A method of soldering a semiconductor body to a metal substrate with solder employing a jig for supplying solder comprising the steps of:

disposing a semiconductor body at a predetermined bonding portion of a metal substrate having said portion for mounting the semiconductor body and a groove extending from said portion to the exterior, and disposing a jig on said metal substrate the jig having a straight through hole extending to a portion of said groove different from that in the bonding region, and supplying melted solder through said straight through hole and said groove to the bonding surfaces.

3. A method of soldering a semiconductor body to a metal substrate with solder according to claim 2, in which said straight through hole in the jig has a funnel portion and a hole portion and a solder solid is first retained in said funnel portion and then is melted by heating and supplied to the groove through said funnel and said hole portion.

* * * * *